(12) United States Patent
Rothschild et al.

(10) Patent No.: US 11,444,027 B2
(45) Date of Patent: Sep. 13, 2022

(54) WAFER-SCALE SATELLITE WITH INTEGRATED PROPULSION AND ATTITUDE CONTROL

(71) Applicant: Massachusetts Institute of Technology, Cambridge, MA (US)

(72) Inventors: Mordechai Rothschild, Newton, MA (US); Sumanth Kaushik, Belmont, MA (US); Melissa A. Smith, Cambridge, MA (US); Livia Racz, Belmont, MA (US); Dennis Burianek, Acton, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 271 days.

(21) Appl. No.: 16/875,367

(22) Filed: May 15, 2020

(65) Prior Publication Data

US 2020/0365512 A1 Nov. 19, 2020

Related U.S. Application Data

(60) Provisional application No. 62/848,227, filed on May 15, 2019.

(51) Int. Cl.
*H01L 23/528* (2006.01)
*H01L 23/48* (2006.01)
(Continued)

(52) U.S. Cl.
CPC .......... *H01L 23/5286* (2013.01); *G01S 19/37* (2013.01); *H01L 21/78* (2013.01); *H01L 23/481* (2013.01)

(58) Field of Classification Search
CPC .... G01S 19/37; H01L 23/5286; H01L 23/481
See application file for complete search history.

(56) References Cited

U.S. PATENT DOCUMENTS 6,137,171 A 10/2000 Joshi
6,830,221 B1 12/2004 Janson et al.
(Continued)

OTHER PUBLICATIONS

Brashears, et al.; "Building the future of WaferSat spacecraft for relativistic spacecraft"; SPIE Optical Engineering + Applications; vol. 9981; Jan. 2016; 9 Pages.
(Continued)

*Primary Examiner* — Marc Anthony Armand
(74) *Attorney, Agent, or Firm* — Daly, Crowley, Mofford & Durkee LLP

(57) ABSTRACT

A wafer-scale satellite bus and a manner of making the same include using wafer reconstruction techniques to stack functional diced circuits onto each other and bond them. The disclosed techniques allow for a variety of functions in each die, including providing, without limitation: ground-based communications, attitude and propulsion control, fuel tanks and thrusters, and power generation. The wafers are initially manufactured according to a common wafer design that provides electrical and power interconnects, then different wafers are further processed using subsystem-specific techniques. The circuits on differently-processed wafers are reconstructed into a single stack using e.g. wafer bonding. Surface components are mounted, and the circuitry is diced to form the final satellites. Mission-specific functions can be incorporated, illustratively by surface-mounting, to the bus at an appropriate stage of assembly, on-wafer circuitry or instrument packages for performing these functions.

20 Claims, 11 Drawing Sheets

(51) Int. Cl.
     H01L 21/78    (2006.01)
     G01S 19/37    (2010.01)

(56) References Cited

U.S. PATENT DOCUMENTS

| | | |
|---|---|---|
| 2008/0303131 A1 | 12/2008 | McElrea et al. |
| 2010/0068844 A1 | 3/2010 | Fazzio |
| 2010/0218805 A1* | 9/2010 | Everett ............... H01L 31/0547 |
| | | 136/246 |
| 2013/0049147 A1 | 2/2013 | Kerwin et al. |
| 2018/0002163 A1 | 1/2018 | Boysel |
| 2018/0205151 A1* | 7/2018 | Celik ...................... H01Q 1/38 |

OTHER PUBLICATIONS

Bruno, et al.; "Simulation of Heat Transfer in Wafer-Integrated Femtosatellites"; Journal of Spacecraft and Rockets; vol. 51; No. 2; Mar.-Apr. 2014; 4 Pages.

Hadaegh, et al.; "On Development of 100-Gram-Class Spacecraft for Swarm Applications"; IEEE Systems Journal; vol. 10; No. 2; Jun. 2016; 12 Pages.

Huang, et al.; "Development of a 100-gm-Class Inspector Satellite Using Photostructurable Glass/Ceramic Materials"; Proceedings of the SPIE; vol. 4637; Jun. 18, 2002; 9 Pages.

Janson; "25 Years of Small Satellites"; $25^{th}$ Annual AIAA/USU Conference on Small Satellites; p. 1-13; Jan. 2011; 13 Pages.

Janson, et al.; "Development of an Inspector Satellite Using Photostructurable Glass/Ceramic Materials"; Space 2005; American Institute of Aeronautics and Astronautics; Aug. 30, 2005-Sep. 1, 2005; 12 Pages.

Janson, et al.; "Mass-Producible Silicon Spacecraft for 21st Century Missions"; Space Technology Conference and Exposition; Jan. 1999; 9 Pages.

Janson; "Micro/Nanotechnology for Micro/Nano/Picosatellites"; Space 2003; American Institute of Aeronautics and Astronautics; Sep. 23-25, 2003; 11 Pages.

Janson; "Micro/Nanotechnology for the satellite world"; Proceeding of the SPIE; Micromachining and Microfabrication; vol. 4981; Jan. 16, 2003; 13 Pages.

Janson; "Silicon satellite: Picosats, Nanosats, and Microsats"; Proceedings of the International Conference on Integrated Micro/Nano-Technology for Space Applications; Jan. 1995; 16 Pages.

Shea; "MEMS for pico- to micro-satellites"; Proceeding of SPIE; vol. 7208; Jan. 2009; 8 Pages.

Sweeting; "Modern Small Satellites—Changing the Economics of Space"; Proceedings of the IEEE; vol. 106; No. 3; pp. 343-361; Mar. 2018; 17 Pages.

Xuwen, et al.; "Silicon Solid-state Small Satellite Design Based on IC and MEMS"; 5th International Conference on Solid-State and Integrated Circuit Technology; pp. 932-935; Jan. 1998; 4 Pages.

International Search Report and Written Opinion of the ISA dated Aug. 19, 2020 for International Application No. PCT/US2020/033066; 8 Pages.

Mihailovic, et al.; "MEMS Silicon-Based Resistojet Micro-Thruster for Attitude Control of Nano-Satellites"; 16th International Solid-State Sensors, Actuators and Microsystems Conference (Online); Jun. 5-9, 2011; 2 Pages.

PCT International Preliminary Report dated Nov. 25, 2021 for International Application No. PCT/US2020/033066; 6 Pages.

* cited by examiner

Tier/Wafer 1
- Payload
- Bus sensors
- Communication

Tier/Wafer 2
- Integrated circuitry (bus control, comms, etc)

Tier/Wafer 3
- In-plane thrusters
- Thruster fuel

Tier/Wafer 4
- Solar power collection
- Battery storage
- Bus sensors
- Out-of-plane thrusters

WAFER-SCALE SATELLITE WITH INTEGRATED PROPULSION AND ATTITUDE CONTROL

CROSS-REFERENCE TO RELATED APPLICATION

This application claims the benefit of U.S. Provisional Application 62/848,227, filed May 15, 2019 and having the same title and inventors. The entire contents of that application are incorporated herein by reference.

GOVERNMENT LICENSE RIGHTS

This invention was made with Government support under Grant No. FA8702-15-D-0001 awarded by the U.S. Air Force. The Government has certain rights in the invention.

BACKGROUND

Artificial satellites are suitable for a wide variety of missions, including cartography, Earth observation (e.g. for gathering weather data or performing surveys), global communications, navigation (such as the Global Positioning System, or GPS), and astronomy, among many others. Satellites may be either specially produced for a single mission, or may instead rely on a general production model called a "satellite bus" that may be adapted to different missions. Satellite buses typically include subsystems that are not mission-specific, and provide a location for one or more mission-specific instrument packages, or payloads.

SUMMARY OF DISCLOSED EMBODIMENTS

Disclosed are a wafer-scale satellite bus and a manner of making the same. Each satellite bus is formed using wafer reconstruction techniques to stack functional diced circuits onto each other and bond them. The disclosed techniques allow for a wide variety of functions in each die, including providing, without limitation: ground-based communications, attitude and propulsion control, fuel tanks and thrusters, and power generation. The wafers are initially manufactured according to a common wafer design that provides electrical and power interconnects, then different wafers are further processed using subsystem-specific techniques. The circuits on differently-processed wafers are reconstructed into a single stack using e.g. wafer bonding. Surface components are mounted, and the circuitry is diced to form the final satellites. Mission-specific functions can be easily incorporated, illustratively by surface-mounting, to the bus at an appropriate stage of assembly, on-wafer circuitry or instrument packages for performing these functions.

Advantageously, this process simultaneously achieves wafer-scale integration without materials limitations, achieves integrated propulsion and attitude control, and has a low cost at scale. When fully built out, manufacturing processes are expected to realize about 5 orders of magnitude reductions in both weight and fabrication cost than comparable, traditional satellites. Embodiments reduce the risk of failure associated with single, large spacecraft. Modularity of the design enables easy replacement or reordering of wafers in the stack, and an endless variety of mission-specific circuit designs using a common bus. Due to the small profile of wafer-scale satellite embodiments, it is expected that they can be used in low-drag missions, especially in low Earth orbit (LEO). Due to their relatively small size and inexpensive cost, satellite embodiments may be deployed in large constellations.

Thus, a first embodiment is a method of manufacturing a satellite. The method includes forming, on wafers, a plurality of uniform bus dice, each bus die comprising interconnects for conveying electrical signals and for powering circuitry connected thereto. The method includes then processing, on each of a plurality of the wafers, the uniform bus dice according to a respective different function selected from a plurality of subsystem functions. The subsystem functions include at least control over spatial attitude and propulsion of the satellite in a microgravity environment. Processing at least one such uniform bus die includes forming a cavity in the bus die and mounting unpackaged circuitry within the cavity. The method finally includes bonding the processed wafers to form the satellite in a stack so as to protect the circuitry mounted within the cavity.

In some embodiments, forming on wafers includes forming on wafers of silicon, or glass, or an organic substrate.

In some embodiments, forming the plurality of uniform bus dice comprises first procuring the wafers; then forming, in each of the wafers, through-wafer vias; then forming, in the through-wafer vias, the interconnects for conveying electrical signals; and then forming, on a top surface and a bottom surface of each of the wafers, the interconnects for powering circuitry connected thereto.

In some embodiments, processing each of the wafers includes processing the wafer to provide, by the wafer: a communication function, or a fuel storage function, or a propulsive function, or an attitude control function, or a power generation function, or a navigation function, or any combination thereof.

In some embodiments, processing each of the wafers includes forming a through-wafer via, or forming a cavity in the wafer, or surface-mounting circuitry diced from the wafer or from a different wafer, or any combination thereof.

Some embodiments further include processing a given wafer according to a mission-specific subsystem function, wherein bonding the stack of the processed wafers includes bonding the stack including the given wafer.

In some embodiments, bonding the stack including the given wafer comprises bonding the stack having, in order: a processed wafer having a communication function; the given wafer; a processed wafer having a propulsive function; and a processed wafer having a power generation function.

In some embodiments, processing the at least one uniform bus die further includes backfilling a cavity in its wafer, or planarizing the bus die for stacking, or both backfilling and planarizing.

In some embodiments, the bonded stack of processed wafers comprises a plurality of satellites, and the method further includes dicing the bonded stack to separate the satellites from each other.

Another embodiment is a satellite having a plurality of wafers. Each wafer includes a uniform bus die having interconnects for conveying electrical signals and for powering circuitry connected thereto. Each wafer also includes the mounted circuitry according to a respective different function in a plurality of subsystem functions. The plurality of subsystem functions includes at least control over spatial attitude and propulsion of the satellite in a microgravity environment. At least one wafer in the plurality of wafers has a cavity into which an unpackaged circuit has been mounted, and the plurality of wafers were bonded to form the satellite in a stacked configuration so as to protect the circuit within the cavity.

In some embodiments, at least one of the plurality of wafers comprises silicon, or glass, or an organic substrate.

In some embodiments, each uniform bus die comprises one or through-wafer vias having interconnects for conveying the electrical signals.

In some embodiments, each uniform bus die comprises, on a top surface and a bottom surface of its wafer, the interconnects for powering circuitry connected thereto.

In some embodiments, the circuitry mounted to each wafer comprises circuitry for providing: a communication function, or a fuel storage function, or a propulsive function, or an attitude control function, or a power generation function, or a satellite control function, or any combination thereof.

In some embodiments, each of the wafers further includes, according to the respective function of the circuitry connected thereto: a through-wafer via, or a cavity in the wafer, or surface-mounting circuitry diced from the wafer or from a different wafer, or any combination thereof.

In some embodiments, a given wafer in the plurality of wafers has a mission-specific subsystem function. The stacked configuration may then have, in order: a processed wafer having a communication function; the given wafer having the mission-specific subsystem function; a processed wafer having a propulsive function; and a processed wafer having a power generation function.

Some embodiments further comprise backfill in the cavity.

In some embodiments, each uniform bus die has been planarized for stacking.

And some embodiments include a plurality of such satellites, in orbit around the Earth and acting separately, or as a cluster, or as a constellation.

It is appreciated that a person having ordinary skill in the art may understand other ways to embody the concepts, techniques, and structures disclosed herein without deviating therefrom.

DESCRIPTION OF THE SEVERAL VIEWS OF THE DRAWINGS

The manner and process of making and using the disclosed embodiments may be appreciated by reference to the drawings, in which.

DETAILED DESCRIPTION

In this specification, including the appended claims, the following quoted terms shall have the indicated meanings that are not limited to specific embodiments, except where expressly indicated otherwise:

"Wafer reconstruction" is a process of forming an integral, handleable wafer by filling gaps between dies after die-to-wafer assembly to allow for further processing on the landing wafer, e.g. thinning, redistribution layer deposition, and bumping.

Figure 1:
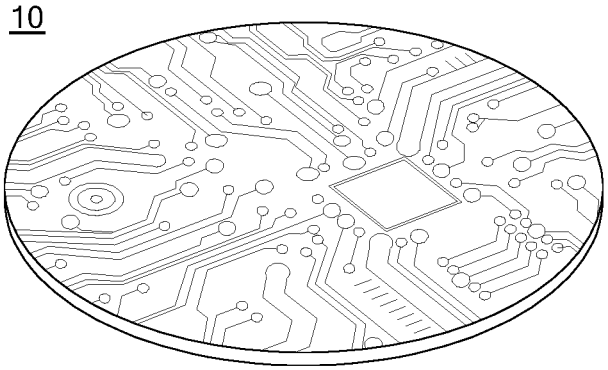
FIG. 1 shows an artistic representation of different wafers that may be used in a wafer-scale satellite according to an embodiment.
Figure 1:
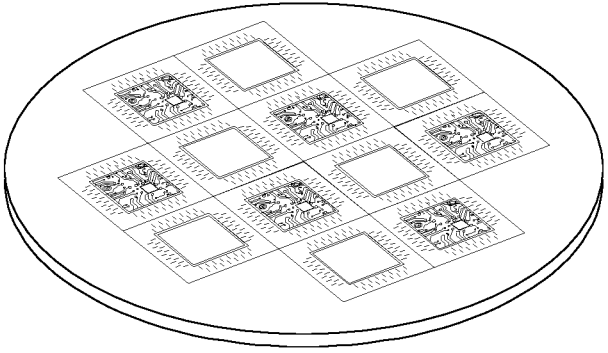
Figure 1:
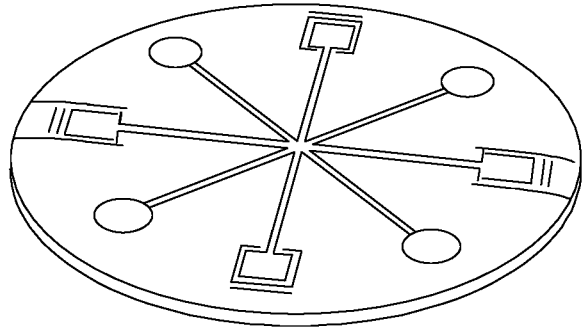
Figure 1:
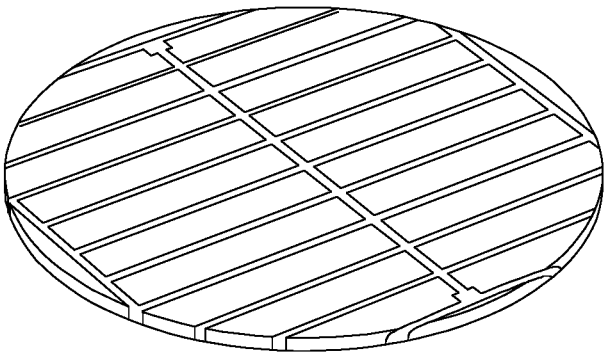
Figure 1A:
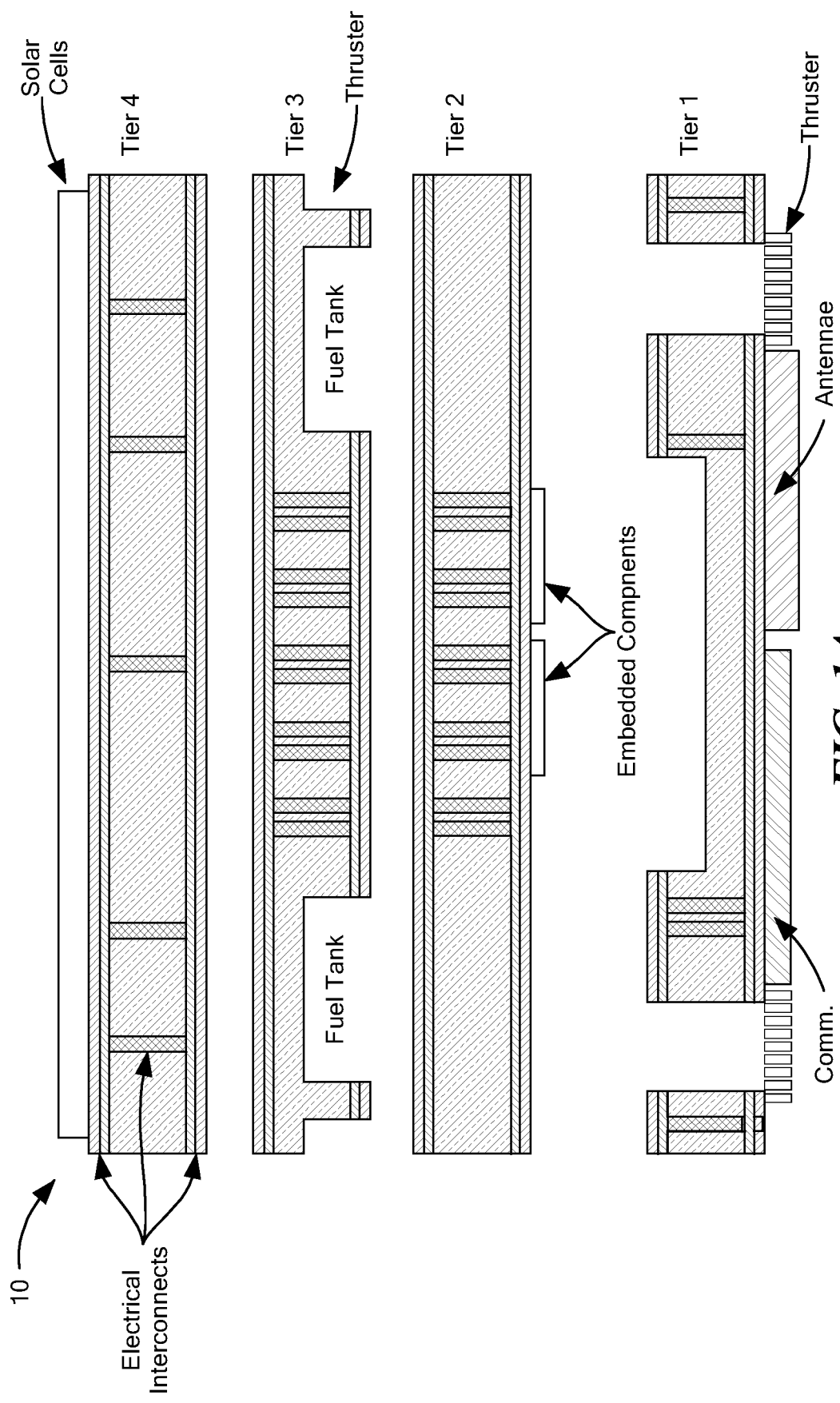
FIG. 1A shows a cartoon of a wafer-scale satellite bus according to an embodiment.

In FIG. 1 is shown an artistic representation of different wafers that may be used in a wafer-scale satellite according to a common bus 10 in an embodiment, while in FIG. 1A is shown an illustrative cartoon cross-section of wafers forming and using the wafer-scale satellite bus 10. The wafer-scale satellite bus 10 has four tiers, indicated as Tier1 through Tier4, that each perform different functions. The combination of these four tiers forms a platform for performing satellite functions that are not mission-specific, including: bus sensors and circuitry (e.g. one or more antennas) for communications with a command-and-control system (Tier1); bus control circuitry, additional comms circuitry if necessary, and guidance and navigation functions (Tier2); attitude control and propulsion, including in-plane thrusters and fuel (Tier1 and Tier3); and power generation (e.g. solar cells), storage (e.g. batteries), and management circuitry, as well as additional bus sensors (Tier4). Mission-specific functions may be added to this satellite bus in a number of ways, including for example by surface mounting embedded components in Tier2 or payloads on the external surfaces of Tier1 or Tier4. The tiers themselves may be manufactured as dice on wafers according to standard manufacturing techniques.

A satellite constructed according to the concepts, techniques, and structures herein may use propulsion methods adapted for low mass objects. In particular, the wafer-scale satellite may use any microelectromechanical system (MEMS) propulsion technique known in the art. Such MEMS systems and techniques include, without limitation: ion electrospray thrusters, microresistojets, microcavity discharge thrusters, and solid/liquid/gas propellant thrusters. A suitable, illustrative electrospray thruster is described in U.S. application Ser. No. 16/872,776 filed May 12, 2020 and entitled "Self-aligned electrospray device and related manufacturing techniques", the entire contents of which are incorporated herein by reference.

It is appreciated that a person having ordinary skill in the art may modify the wafer-scale satellite bus 10 of FIGS. 1 and 1A in a number of ways without deviating from the concepts, techniques, and structures disclosed herein. For example, the common satellite bus 10 may require or benefit from the addition or subtraction of other tiers performing different functions, e.g. related to integration with a satellite deployment system, testing and configuration using an external diagnostic and repair system, or interactions with other mission-agnostic systems. Thus, a wafer-scale satellite bus need not always have the four tiers illustrated in FIGS. 1 and 1A, or tiers having the same functions. It is also appreciated that the wafers shown in FIGS. 1 and 1A may be designed differently to provide their functions as indicated, and thus that the designs shown in these Figures are illustrative only. It is further appreciated that the functions of a particular tier in the common bus may be split across multiple wafers in an embodiment.

Figure 2:
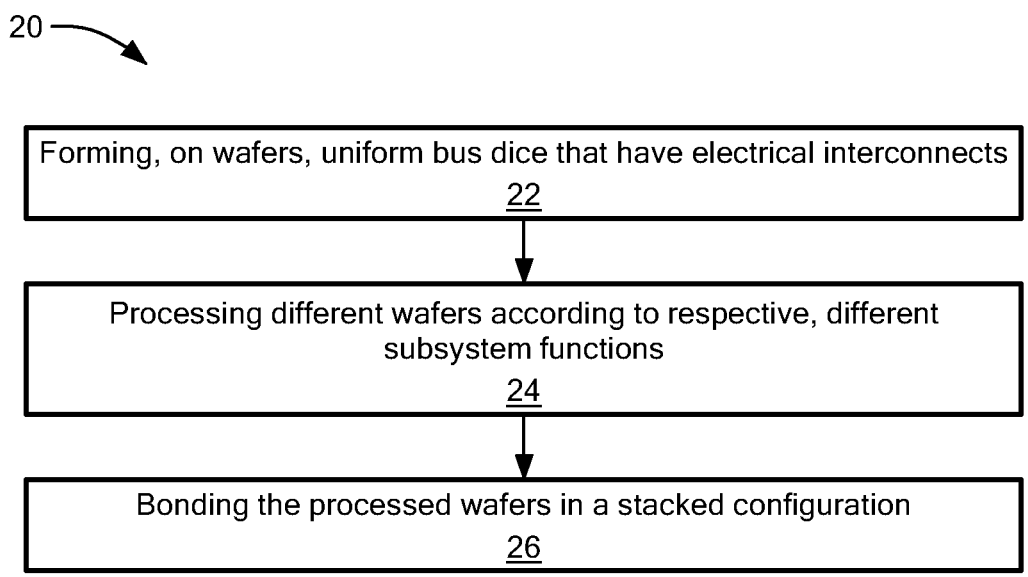
FIG. 2 is a flowchart of a method of manufacturing a satellite according to a satellite bus.

In FIG. 2 is shown a flowchart of a method 20 of manufacturing a satellite according to a wafer-scale satellite bus. The method may produce, for example, a satellite using the wafer-scale satellite bus 10 of FIGS. 1 and 1A.

A first process 22 of the method 20 includes forming, on wafers, a plurality of uniform bus dice that have electrical interconnects. The wafers may comprise silicon, or glass, or an organic substrate for example, or any material that may be processed in accordance with the concepts, techniques, and structures described herein. The electrical interconnects provide at least two functions in the satellite bus. The first function is to convey electrical signals between different portions of the satellite, including signals for opening or closing thruster valves, mission-specific data signals, and so on. The second function is powering circuitry contained within or mounted on the surface of the satellite, including solar panels, antennae for communication, command-and-control circuitry, other mission-agnostic circuitry in the common bus, and mission-specific circuitry.

A second process 24 of the method 20 includes processing or manufacturing different wafers according to respective, different subsystem functions. That is, while the first process 22 produces bus dice that initially have a substantially identical structure (i.e. the bus dice are "uniform" across different wafers), the second process 24 divides the wafers into functional groups and performs additional manufacturing on each group according to its function. Some wafers may be processed to provide communication functions, as in Tier1 of FIGS. 1 and 1A. Other wafers may be processed to provide guidance and navigation functions, as in Tier2. Additional wafers may be processed to provide fuel storage or attitude and propulsion functions, as in Tier3. Still other wafers may be processed to provide power generation, as in Tier4. It is appreciated that wafers may be processed to provide other functions not just described, in accordance with the teachings herein.

In practical embodiments for carrying out a particular mission, the processing may include forming a cavity in a bus die of one or more of the wafers, and mounting mission-specific circuitry, or forming such circuitry directly, within the cavity. Such mission-specific circuitry is herein considered to utilize the common bus (i.e. its signal paths and power paths) without being a constituent component thereof. Thus, the wafer-scale satellite bus is a modular platform for the addition of mission-specific circuitry. In accordance with embodiments, the mission-specific circuitry, when mounted in the cavity, may be unpackaged; that is, it may lack a coating or other protective barrier, such as a cap, between the environment and its conductive or functional components.

A third process 26 of the method 20 includes bonding the processed wafers in a stacked configuration to form the satellite. Advantageously, the third process 26 may use wafer reconstruction techniques, as known in the art. Because the processed wafers are in a stacked configuration, any wafer cavity in which unpackaged circuitry is internally mounted will be covered and sealed by the substrate of the adjacently stacked wafer, thereby protecting the circuitry from the external environment without the need for per-circuit packaging. In particular, manufacturing advantages are realized, such as the ability to form bus-specific circuitry directly in the cavity when processing the wafer, or to allow a mission customer to provide mission-specific circuitry whose manufacture does not require additional packaging processes and cost.

In accordance with illustrative embodiments, the first process 22 produces bus dice that initially have a substantially identical structure, and are not mission-specific. The first process 22 therefore may be carried out on a large scale for relatively low expense. Moreover, the nearly identical structures of these bus dice after processing allows for simple integration when they are combined to form a satellite. Nevertheless, the satellite bus design is highly modular and flexible, since wafers containing bus dice that are initially the same are subsequently processed differently in the second process 24 to provide whatever functions are required to satisfy the ultimate mission of the satellite. In particular, satellite customers may provide their own mission-specific dice (whether environmentally packaged or not) that can be easily incorporated into the satellite bus design by reconstructing uniformly-manufactured wafers. Also, some functions, such as attitude control or propulsion, need not be provided in some satellites, thereby realizing a cost savings that may be passed along to the satellite customer.

Figure 3A:
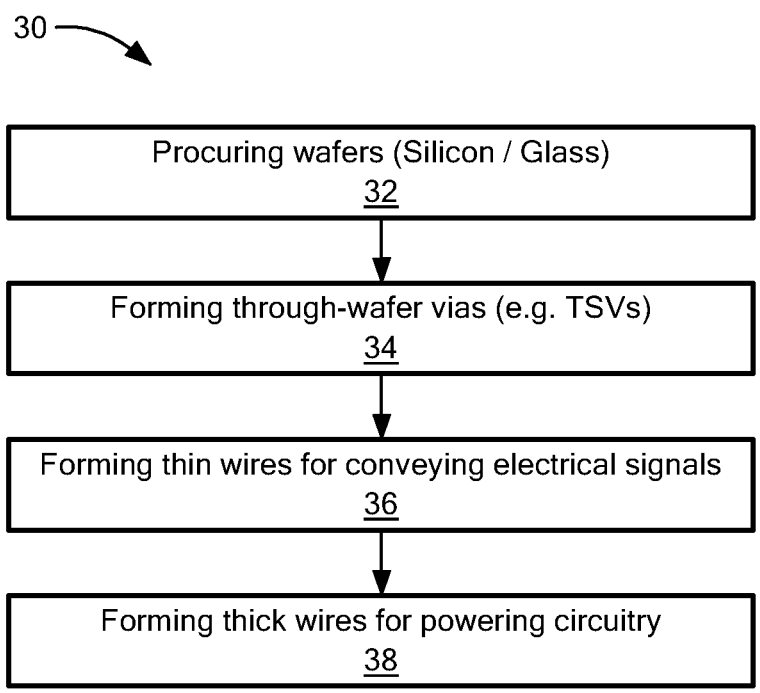
FIG. 3A is a flowchart of a method of forming standardized bus dice.
Figure 3B:
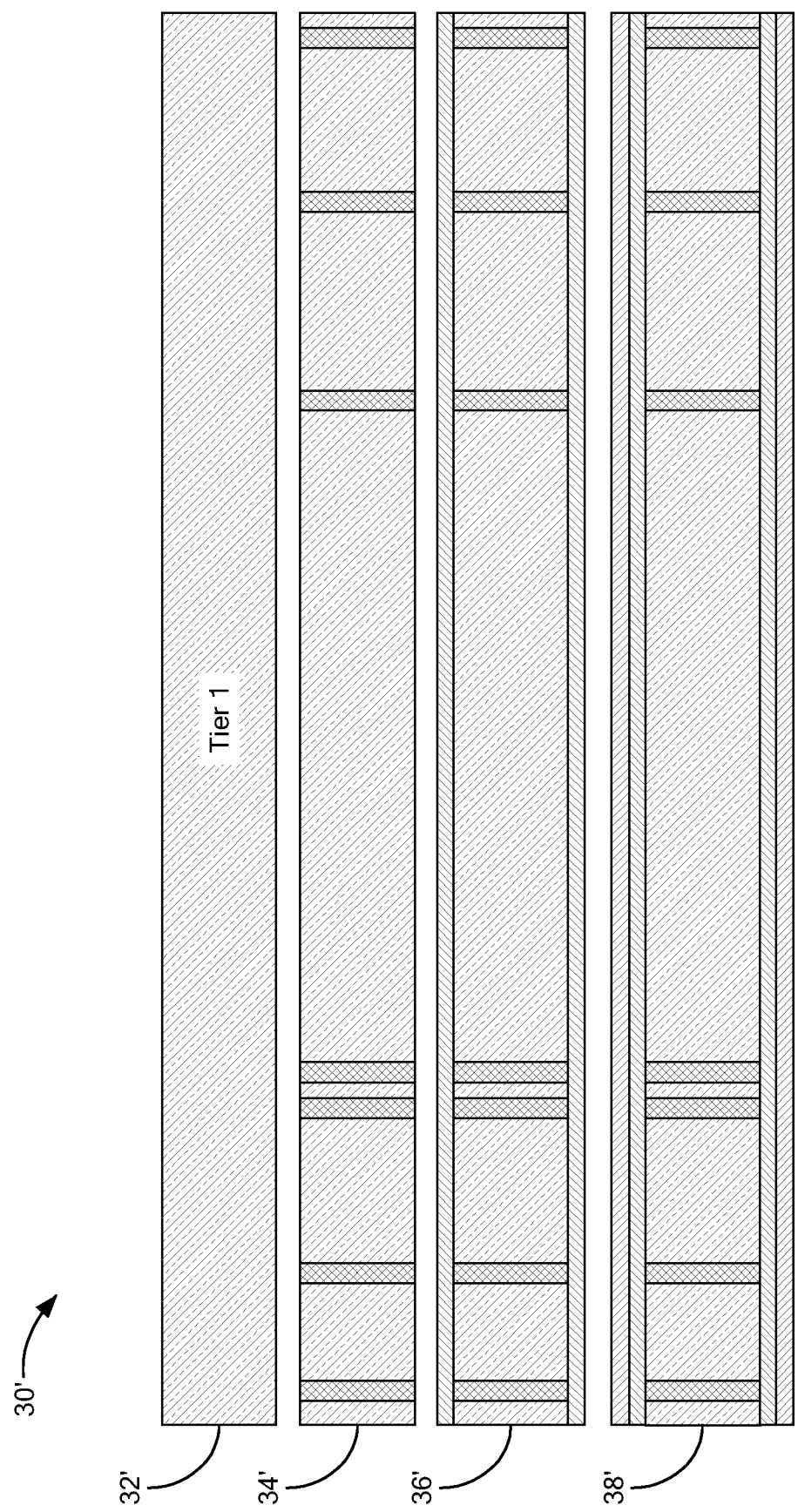
FIG. 3B is a cartoon of a bus die on a wafer at different stages in the processing of FIG. 3A.

In FIG. 3A is shown a flowchart of a method 30 of forming uniform bus dice. The method 30 may be used, for example, to implement the process 22 of FIG. 2. FIG. 3B is a cartoon 30' of a single bus die on a wafer at different stages in the method 30 of FIG. 3A. The manufacturing processes for performing each of the processes of the method 30 are known in the art. It is appreciated that the cartoon 30' represents only one bus die, but that a wafer containing many such dice may be processed so that all of the dice are manufactured in a substantially similar fashion at once.

A first process 32 of the method 30 is procuring wafers that will become the standardized bus dice. An illustrative partial cross-section of a wafer after process 32, e.g. one to be used as Tier1 in the wafer-scale satellite bus 10 of FIG. 1A, is shown in FIG. 3B as item 32'. These wafers may be, for example, silicon or glass. Alternately, they may be rigid or flexible organic substrates, or generally any substrate that can be formed into a printed circuit board by standard manufacturing processes known in the art (e.g. lithography, vapor deposition, epitaxy, wet and dry etching, and so on).

A second process 34 of the method 30 is forming through-wafer vias. An illustrative partial cross-section of a wafer after process 34 is shown as item 34'. For example, if the wafers are made of silicon, then process 34 includes forming through-silicon vias, or TSVs, as that term is known in the art.

A third process 36 of the method 30 is forming thin wires for conveying electrical signals. An illustrative partial cross-section of a wafer after process 36 is shown as item 36'. As shown in FIG. 3B, forming the thin wires may include, for example, filling the through-wafer vias and coating the surfaces of the wafer with an electrically conductive material. The material may be a metal, such as copper or other electrically conductive material.

A fourth process 38 of the method 30 is forming thick wires for use powering circuitry. An illustrative partial cross-section of a wafer after process 38 is shown as item 38'. The fourth process 38 may include, for example, metal deposition or other technique known in the art, provided that the thick wires formed in the process 38 are electrically insulated from the thin wires formed in the process 36.

Figure 4A:
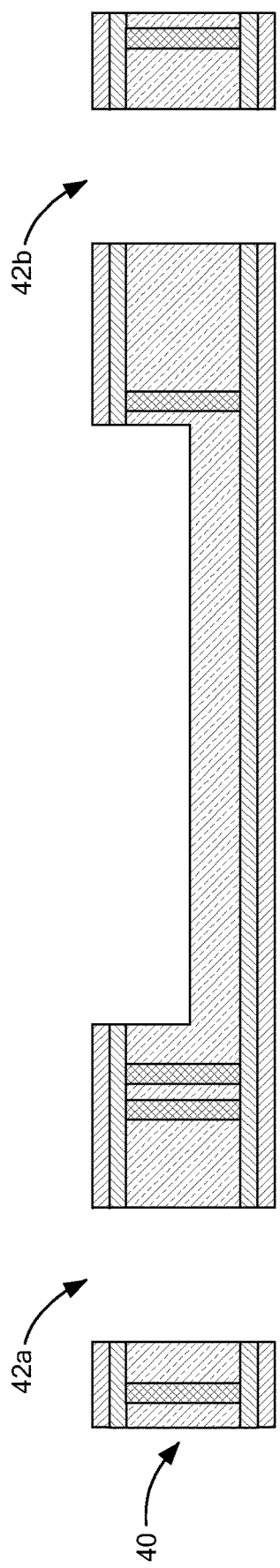
FIGS. 4A and 4B are cartoons of processing the standardized bus dice according to different subsystem functions.
Figure 4B:
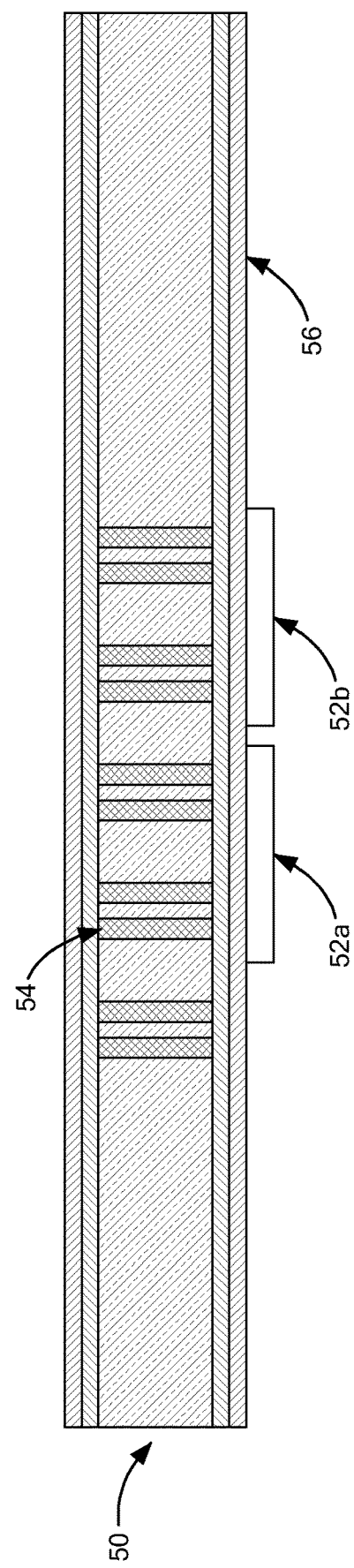

In FIGS. 4A and 4B are shown cartoons of processing two standardized bus dice 40 and 50 according to different subsystem functions. In particular, FIG. 4A illustrates processing on a wafer that might be used as Tier1 in the satellite bus 10 of FIGS. 1 and 1A, while FIG. 4B illustrates processing on a wafer that might be used as Tier2 in the satellite bus 10 of FIGS. 1 and 1A. The standardized bus dice 40 and 50 may be formed, for example, using the method 30 illustrated in FIGS. 3A and 3B. The cartoons of FIGS. 4A and 4B may correspond, for example, to process 24 of the method 20 of FIG. 2.

FIG. 4A illustrates the end result of one possible processing of a standardized bus die 40 to prepare it for final assembly in a satellite. Two through-wafer vias 42a and 42b allow fuel to escape via Tier1 thrusters 47a and 47b (shown in FIG. 4D). Also, a deep cavity 44 is provided to receive and package the embedded circuitry 52a and 52b inside the satellite. The vias 42a and 42b and the deep cavity 44 may be formed using techniques known in the art of wafer processing.

FIG. 4B illustrates the end result of one possible processing of a standardized bus die 50 to prepare it for final assembly in a satellite. Tier2 contains embedded circuitry 52a and 52b, which are mounted to a surface of the bus die 50 using techniques known in the art. Importantly, the embedded circuitry 52a and 52b are mounted so as to electrically couple to one or more of the thin wires 54 for communicating data, and to one or more of the thick wires 56 for being powered. In this way, the embedded circuitry 52a and 52b is operatively coupled to other parts of the satellite, including for example solar cells for generating power in Tier4 and attitude and propulsion control thrusters in Tier1 and Tier3.

Figure 4C:
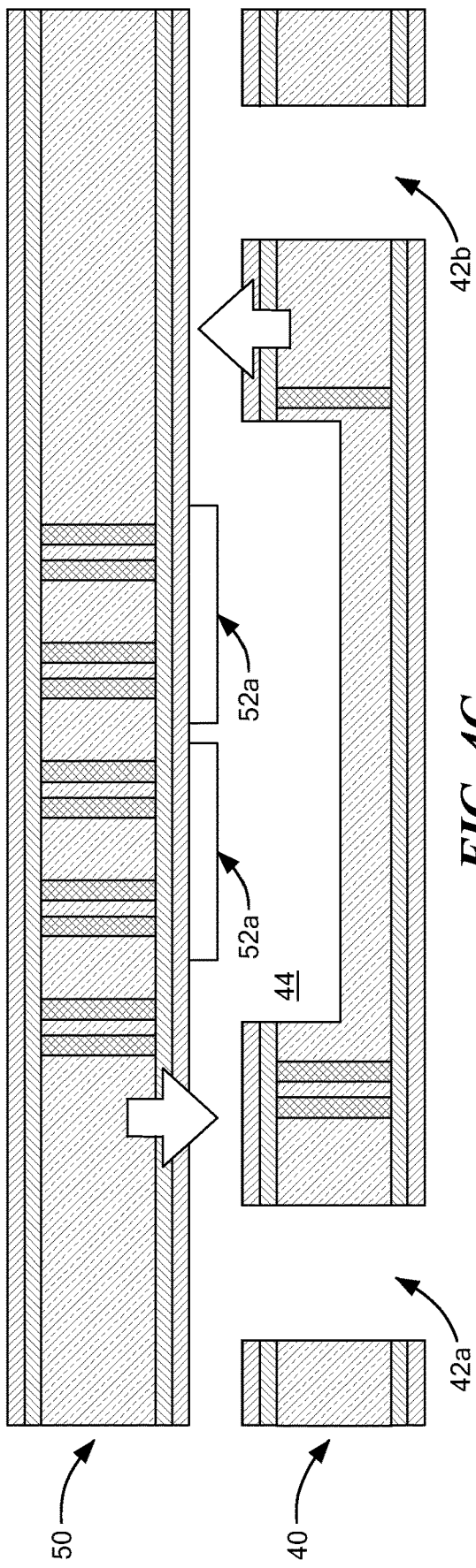
FIG. 4C is a cartoon of stacking the processed bus dice according to a final assembly.

In FIG. 4C is shown a cartoon of stacking the processed bus dice 40 and 50 according to a final assembly. Thus, the bus die 40 and the bus die 50 are stacked, as indicated by the green arrows. Once these dice 40 and 50 are placed, and once any additional dice (not shown) required to meet mission parameters are placed in the same stack, the stack may be wafer bonded (for example, as in process 26 of method 20).

Figure 4D:
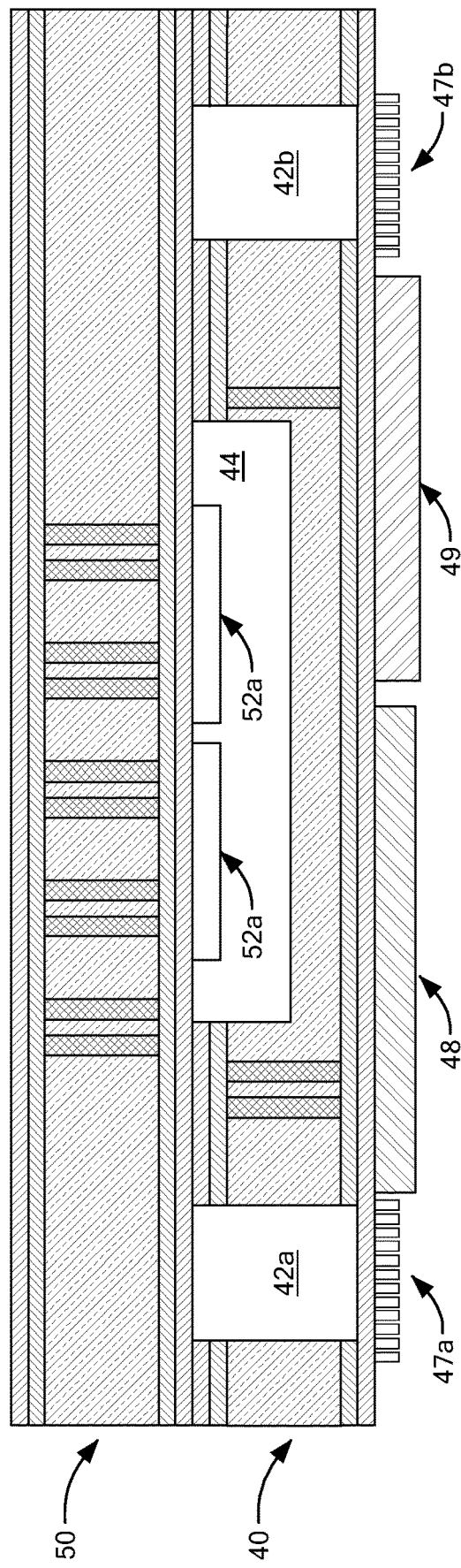
FIG. 4D is a cartoon of stacked, bonded dice with surface-mounted components according to a portion of an assembled wafer-scale satellite.

In FIG. 4D is shown a cartoon of the stacked, bonded dice 40 and 50 with additional surface-mounted components according to a portion of an assembled wafer-scale satellite. Thus, thrusters 47a and 47b are shown. These thrusters 47a and 47b may be operated in conjunction with other thrusters (shown in FIG. 1A) to provide propulsion and/or attitude control. In FIG. 4, the Tier1 die 40 shows the result of additional processing to surface mount communication circuitry 48 and one or more antennae 49 that are used to provide data communications with other systems and devices.

Figure 5:
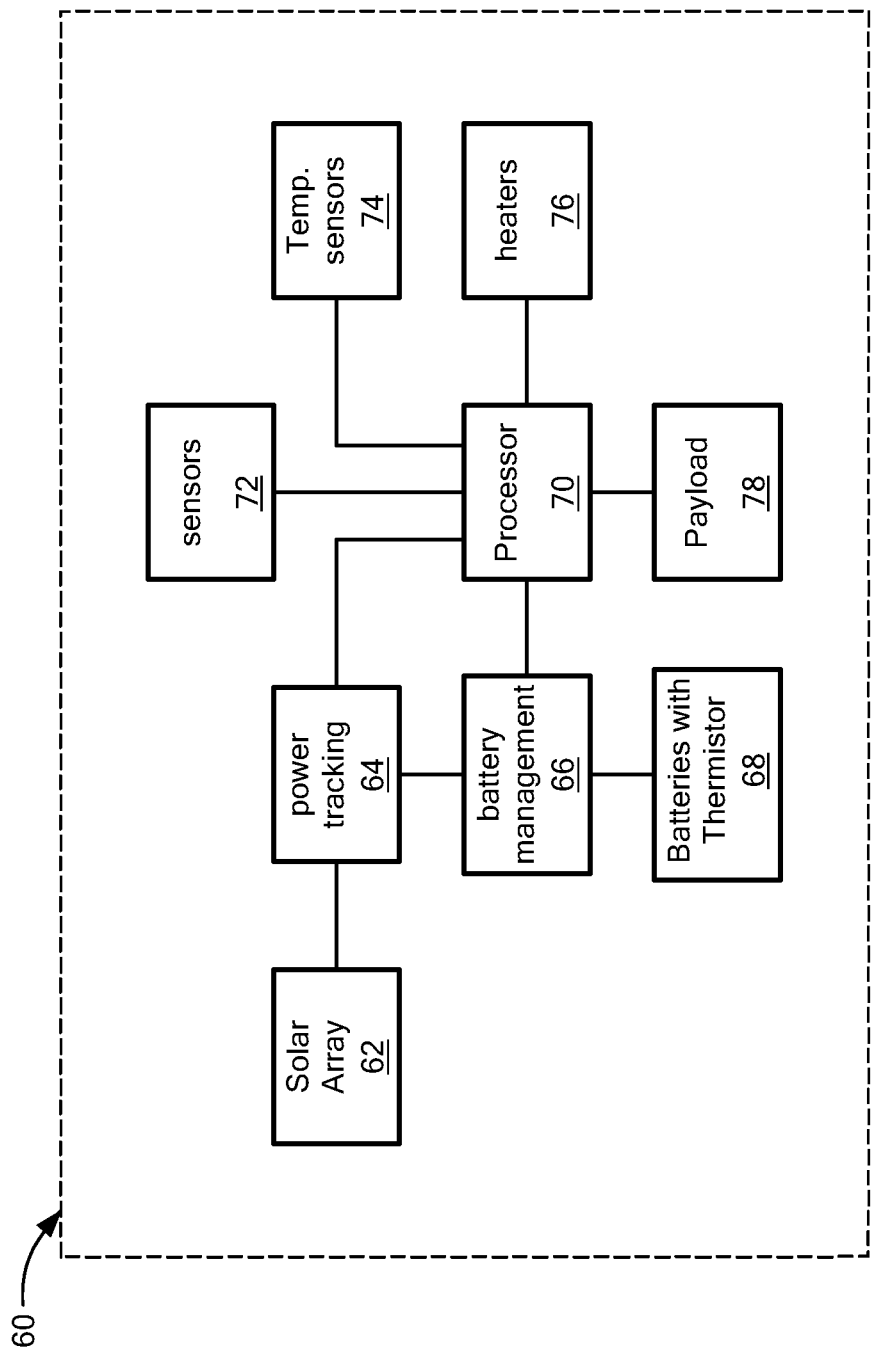
FIG. 5 schematically shows a computerized system whose components are connected using the wafer-scale satellite bus according to an embodiment.

FIG. 5 schematically shows a computerized system 60 whose components are connected using the wafer-scale satellite bus according to an embodiment. The computerized system 60 includes a number of components that may form part of, or be interconnected and/or powered by, the wafer-scale satellite bus 10 shown in FIGS. 1 and 1A. The entire collection of components may be implemented on wafers that are assembled into a satellite according to the processes in FIG. 2. Individual components may be formed on wafers, or formed inside cavities in wafers, or procured separately then mounted into such cavities, according to the processes shown in FIGS. 4A through 4D.

FIG. 5 illustrates functional components of a computerized system 60 whose physical implementations may be provided by electronic circuitry. This disclosure does not include detailed implementation details of such circuitry for performing some of the functions described in connection with this Figure, as these details already are known in the art. Rather, embodiments described herein unify these circuits using a previously unknown, modular, wafer-scale, satellite bus platform, as claimed below, that is reconfigurable according to mission needs while lending itself to simple and economical mass production, and is adaptable to perform mission-specific functions by adding various payload circuitry.

As described above in connection with FIG. 2, the common bus includes various power generation, management, and storage circuitry for powering circuitry within the satellite. Thus, the computerized system 60 includes a solar array 62 (e.g. an array of photovoltaic cells) for producing electrical power from sunlight. The solar array 62 may include power conditioning electronics, as known in the art, to supply downstream components with electrical power having (for example) fewer voltage fluctuations and electromagnetic interference than the raw output of the photovoltaic cells.

The computerized system 60 also includes a power tracking unit 64 for tracking the amount of power being generated by the solar array 62, and being consumed by the computing processor 70 described below. The power tracking unit 64 is illustratively implemented using purpose-designed circuitry, such as an application-specific integrated circuit (ASIC) or a field-programmable gate array (FPGA) or other technology known in the art. The amount of power being generated by the solar array 62 may fluctuate for a variety of reasons, including primarily an angle between a vector perpendicular to a plane of the solar array 62 and a vector from the satellite to the sun, as well as other factors known in the art, such as gradual loss of efficiency in the photovoltaic cells over time. The amount of power being consumed by the computing processor 70 may fluctuate for a variety of reasons, including primarily an entropic computing workload.

The computerized system 60 also includes a battery management unit 66 for directing electrical power in the system 60. The power tracking unit 64 is illustratively implemented using purpose-designed circuitry, such as an ASIC or FPGA. The battery management unit 66 may direct electrical power generated by the solar array 62 to the computing processor 70. If the solar array 62 is generating excess electrical power, as determined by the power tracking unit 64, then the battery management unit 66 may direct the excess power into batteries 68, described below. If the solar array 62 is generating insufficient electrical power for the computing processor 70, as determined by the power tracking unit 64, then the battery management unit 66 may direct power from the batteries 68 into the computing processor 70 to compensate. In this way, the computing processor 70 always is supplied with sufficient electrical power.

In the event that the batteries 68 are depleted, the battery management unit 66 may signal the computing processor to enter a low-power state, such as a "sleep" state in which computation performed on behalf of a mission-specific payload 78 is halted, or a "hibernation" state in which all computation is halted until the batteries 68 are sufficiently recharged. These low-power states are described only illustratively, and it is appreciated that other embodiments may perform other battery management techniques known in the art.

The computerized system 60 further includes electrical power storage devices (batteries) 68 having a thermistor for monitoring temperature. As known in the art, a thermistor is a temperature-dependent (i.e. "thermal") resistor. Satellite components often are exposed to sudden and extreme temperature swings as they become illuminated or become darkened due to changes in orientation relative to the sun, or interposition of an eclipsing body (i.e., the Earth). These temperature changes, along with resistive heating due to charging, can take batteries 68 outside of their optimal operating temperature ranges. Thus, the batteries 68 are provided with a thermistor whose resistance may be monitored. When that resistance indicates a non-optimal battery temperature, the battery management unit 66 may direct power toward or away from the batteries 68 to compensate.

The primary computing function of the computerized system 60 is provided by a computing processor 70. The computing processor 70 may be any computing processor known in the art that is suitable for use in outer space and orbital applications, such as a radiation-hardened central processing unit (CPU). The computing processor 70 is primarily powered by the solar array 62 and secondarily powered by the batteries 68, under control of the battery management unit 66. The computing processor 70 may receive electrical signals from, process, and deliver electrical signals to the power tracking unit 64, the battery management unit 66, and the other components described below. The computing processor 70 may include volatile or non-volatile memory (not shown in the Figures) for temporarily or permanently storing data used in performing computations. Like the other components in the computerized system 60, the computing processor 70 is powered by, and conveys electrical signals using, the uniform satellite bus described herein.

The computerized system 60 further includes sensors 72, which relay data to the computing processor 70. These sensors 72 may include, without limitation: inertial measurement units (IMU), global positioning system (GPS) units, star trackers or other imaging sensors, magnetometers, multicomponent radiation sensors, plasma probes, magnetic gradiometers, atomic oxygen sensors, radio communication antennas, optics for optical communication, and/or other scientific instruments known in the art that are desirable to have on a general-purpose satellite platform. It is appreciated that the sensors just listed are merely illustrative, and that other sensors may be present in various embodiments.

The computerized system 60 also includes a thermal regulation system with temperature sensors 74 and heaters 76. The temperature sensors 74 and heaters 76 may be implemented using known techniques and hardware. The temperature sensors 74 may sense an ambient temperature, if located on the exterior of the satellite, thereby providing information to the computing processor 70 that may assist the computing processor 70, for example, in computing the satellite's current spatial orientation relative to the sun.

The temperature sensors 74 also may sense an internal temperature at a particular location in (or on) the satellite mass, thereby providing further information to the computing processor 70. If the computing processor 70 determines, based on this further information, that a particular component near one of the temperature sensors 74 is outside of its acceptable operating temperature range (and in particular, is too cold for optimal function), then the computing processor 70 may send a signal to one or more of the heaters 76 to warm up the component and thereby improve its operation.

The above-described components of the computerized system 60, or some subset of them, may be considered to form a wafer-scale satellite platform having a common bus. Wafers implementing these components in tiers may be mass produced without regard to the particular mission objectives that must be achieved. However, in addition to these components, the satellite platform may be provided with a mission-specific payload 78 for performing particularized functions. The mission-specific payload 78 may be, for example: an ASIC or FPGA, an embedded system, a system-on-a-chip (SoC), or other electronic circuitry capable of being powered by the satellite bus and using it to convey meaningful electrical signals to and from the computing processor 70.

In various embodiments, the payload 78 may access data received by the computing processor 70 from any of the other components via dedicated registers, or other standardized data access techniques such as accessing a volatile memory of the computing processor 70 according to fixed locations associated with each of the other components. The payload 78 may then perform its own computations on these sensor data, then direct the computing processor 70 to transmit the results of these computations to another space-based, airborne, or ground-based computer system via a radio or optical communication device.

Figure 6A:
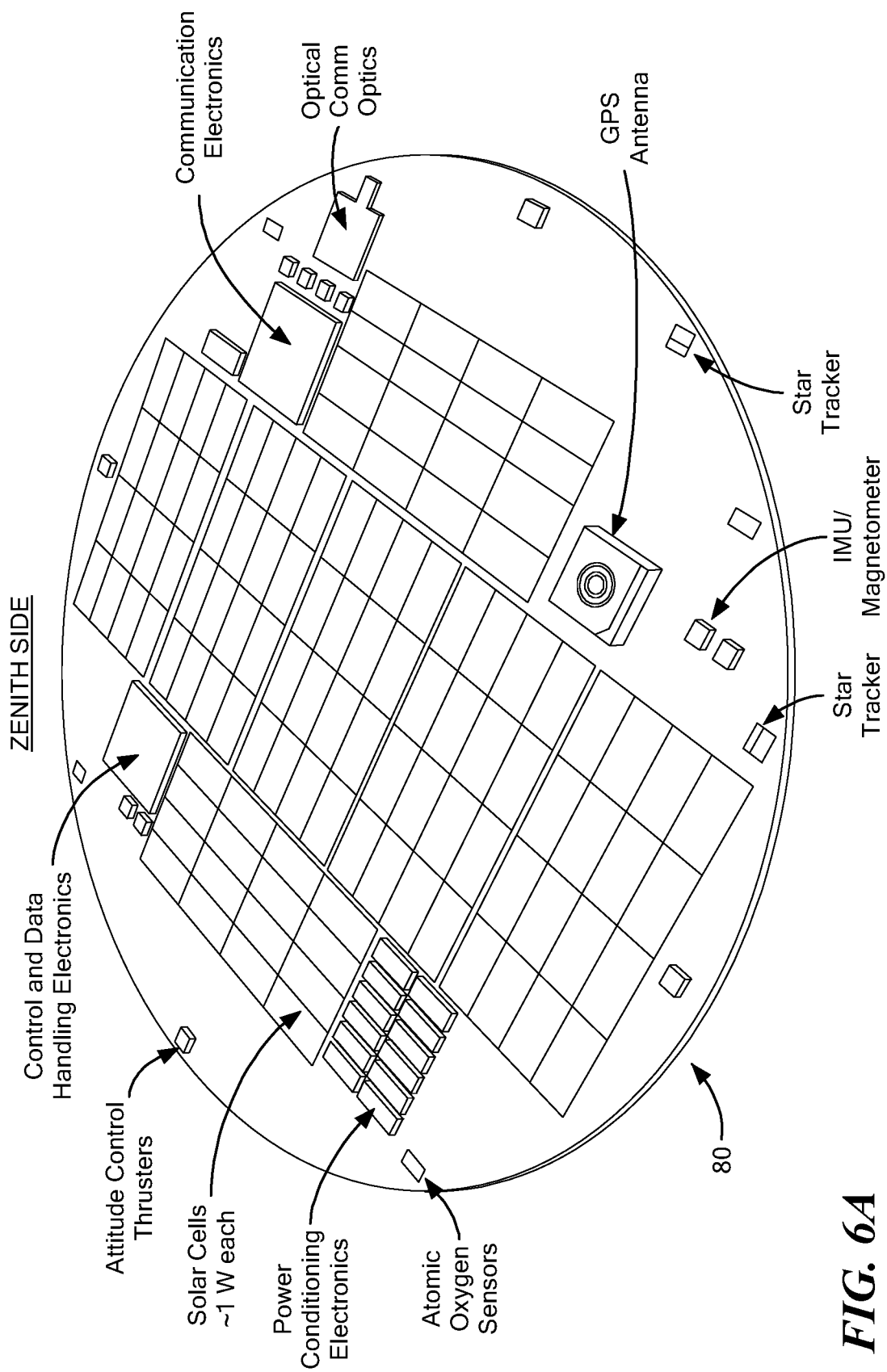
FIGS. 6A and 6B show artistic representations of the top (zenith) and bottom (nadir) sides of an illustrative embodiment.
Figure 6B:
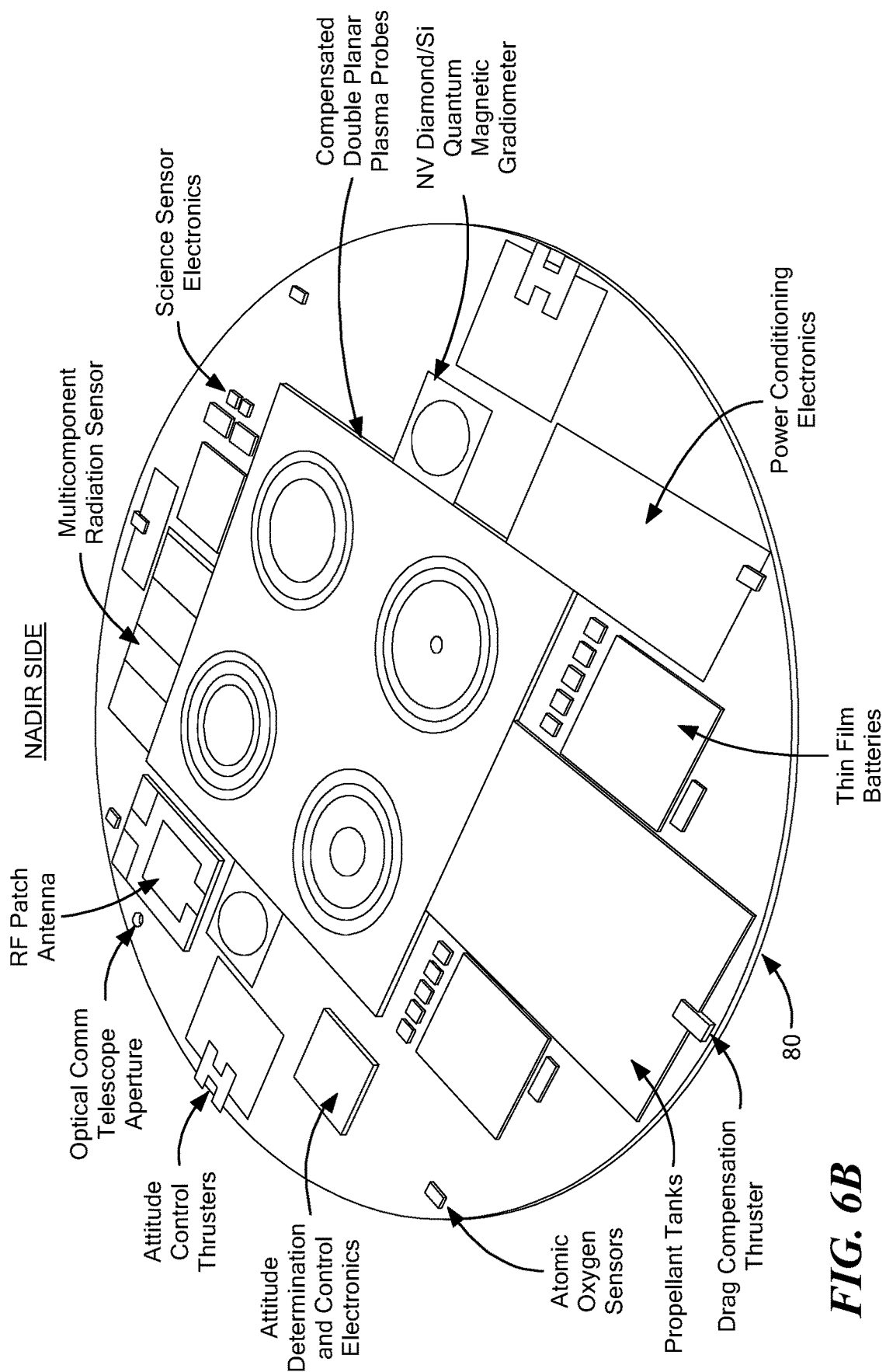

In FIGS. 6A and 6B are shown artistic representations of the top (zenith) and bottom (nadir) sides of a wafer-scale satellite 80 according to an embodiment. The components shown in FIGS. 6A and 6B are themselves well-known in the art, and are not described in detail herein other than to indicate that they may be present in a wafer-scale satellite bus platform according to various embodiments.

In FIG. 6A is shown various components that may be found on the zenith side of the satellite 80 (similar to Tier4 of FIGS. 1 and 1A). Thus, FIG. 6A shows control and data handling electronics, communication electronics, optical communication optics, a GPS antenna, an IMU/magnetometer, star trackers, atomic oxygen sensors, power conditions electronics, an array of solar cells producing about 1 Watt of power each, and attitude control thrusters. As indicated in connection with FIGS. 1 and 1A, is appreciated that these and other functional components may or may not be present and mounted on or integral with this wafer.

Likewise, in FIG. 6B is shown various components that may be found on the nadir side of the satellite 80 (similar to Tier1 of FIGS. 1 and 1A). Thus, FIG. 6B shows a radio frequency (RF) patch antenna, a multicomponent radiation sensor, science sensor electronics, compensated double planar plasma probes, a nitrogen-vacancy (NV) diamond/silicon quantum magnetic gradiometer, power conditioning electronics, thin film batteries, a drag compensation thruster and propellant tanks, more atomic oxygen sensors, attitude determination and control electronics, attitude control thrusters, and an optical communications telescope aperture. As indicated in connection with FIGS. 1 and 1A, is appreciated that these and other functional components may or may not be present and mounted on or integral with this wafer.

Figure 7:
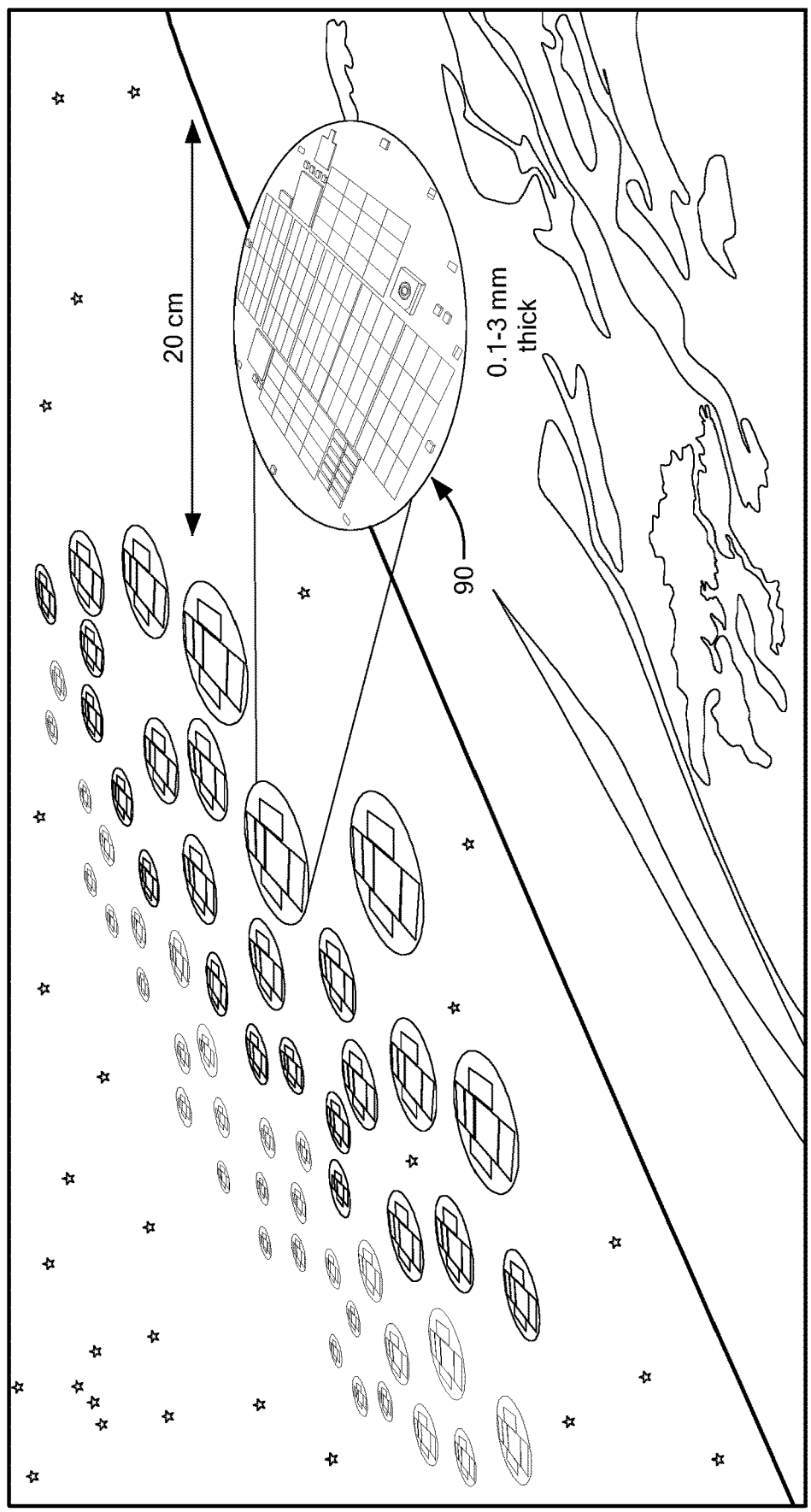
FIG. 7 shows an artistic representation of an array of wafer-scale satellites deployed in Earth orbit according to an embodiment.

FIG. 7 shows an artistic representation of an array of wafer-scale satellites deployed in Earth orbit according to an embodiment. The array comprises many satellites, such as satellite 90, which are manufactured using the wafer-scale satellite bus described herein. The satellite subsystems are either fabricated directly onto the various wafers, or are pre-fabricated with the wafer serving as a carrier. The standardization of the satellite bus, and its subsequent capability for mass production, yield cost and size numbers that enable an array to include large numbers of such satellites. The satellites in the array may act separately, as a cluster, or as a constellation. Thus, embodiments enable massively distributed space systems at low cost.

In the foregoing detailed description, various features of embodiments are grouped together in one or more individual embodiments for the purpose of streamlining the disclosure. This method of disclosure is not to be interpreted as reflecting an intention that claimed embodiments require more features than are expressly recited in each claim. Rather, inventive aspects may lie in less than all features of each disclosed embodiment.

Having described implementations which serve to illustrate various concepts, structures, and techniques which are the subject of this disclosure, it will now become apparent to those of ordinary skill in the art that other implementations incorporating these concepts, structures, and techniques may be used. Accordingly, it is submitted that that scope of the patent should not be limited to the described implementations but rather should be limited only by the spirit and scope of the following claims.

What is claimed is:

1. A method of manufacturing a satellite, the method comprising:
    forming, on wafers, a plurality of uniform bus dice, each bus die in the plurality of uniform bus dice comprising interconnects for conveying electrical signals and for powering circuitry connected thereto;
    processing, on each of a plurality of the wafers, the uniform bus dice according to a respective different function in a plurality of subsystem functions that includes at least control over spatial attitude and propulsion of the satellite in a microgravity environment, wherein processing at least one such uniform bus die includes forming a cavity in the bus die and mounting unpackaged circuitry within the cavity; and
    bonding the processed wafers to form the satellite in a stack so as to protect the circuitry mounted within the cavity.

2. The method according to claim 1, wherein forming on wafers includes forming on wafers of silicon, or glass, or an organic substrate.

3. The method according to claim 1, wherein forming the plurality of uniform bus dice comprises:
    forming, in each of the wafers, through-wafer vias;
    forming, in the through-wafer vias, the interconnects for conveying electrical signals; and
    forming, on a top surface and a bottom surface of each of the wafers, the interconnects for powering circuitry connected thereto.

4. The method according to claim 1, wherein processing each of the wafers includes processing the wafer to provide, by the wafer: a communication function, or a fuel storage function, or a propulsive function, or an attitude control function, or a power generation function, or a satellite control function, or any combination thereof.

5. The method according to claim 1, wherein processing each of the wafers includes forming a through-wafer via, or forming a cavity in the wafer, or surface-mounting circuitry diced from the wafer or from a different wafer, or any combination thereof.

6. The method according to claim 1, further comprising processing a given wafer according to a mission-specific subsystem function, wherein bonding the stack of the processed wafers includes bonding the stack including the given wafer.

7. The method according to claim 6, wherein bonding the stack including the given wafer comprises bonding the stack having, in order: a processed wafer having a communication function; the given wafer; a processed wafer having a propulsive function; and a processed wafer having a power generation function.

8. The method according to claim 1, wherein processing the at least one uniform bus die further includes backfilling a cavity in its wafer, or planarizing the bus die for stacking, or both backfilling and planarizing.

9. The method according to claim 1, wherein the bonded stack of processed wafers comprises a plurality of satellites, the method further comprising dicing the bonded stack to separate the satellites from each other.

10. A satellite comprising:
    a plurality of wafers, each wafer comprising a uniform bus die having interconnects for conveying electrical signals and for powering circuitry connected thereto, each wafer further comprising the circuitry connected thereto according to a respective different function in a plurality of subsystem functions that includes at least control over spatial attitude and propulsion of the satellite in a microgravity environment;
    wherein at least one wafer in the plurality of wafers comprises a cavity into which an unpackaged circuit has been mounted; and
    wherein the plurality of wafers were bonded to form the satellite in a stacked configuration so as to protect the circuit within the cavity.

11. The satellite according to claim 10, wherein at least one of the plurality of wafers comprises silicon, or glass, or an organic substrate.

12. The satellite according to claim 10, wherein each uniform bus die comprises one or through-wafer vias having interconnects for conveying the electrical signals.

13. The satellite according to claim 10, wherein each uniform bus die comprises, on a top surface and a bottom surface of its wafer, the interconnects for powering circuitry connected thereto.

14. The satellite according to claim 10, wherein the circuitry mounted to each wafer comprises circuitry for providing: a communication function, or a fuel storage function, or a propulsive function, or an attitude control function, or a power generation function, or a satellite control function, or any combination thereof.

15. The satellite according to claim 10, wherein each of the wafers further includes, according to the respective function of the circuitry connected thereto: a through-wafer via, or a cavity in the wafer, or surface-mounting circuitry diced from the wafer or from a different wafer, or any combination thereof.

16. The satellite according to claim 10, wherein a given wafer in the plurality of wafers has a mission-specific subsystem function.

17. The satellite according to claim 16, wherein the stacked configuration has, in order: a processed wafer having a communication function; the given wafer having the mission-specific subsystem function; a processed wafer having a propulsive function; and a processed wafer having a power generation function.

18. The satellite according to claim 10, further comprising backfill in the cavity.

19. The satellite according to claim 10, wherein each uniform bus die has been planarized for stacking.

20. A plurality of satellites according to claim 10, in orbit around the Earth and acting separately, or as a cluster, or as a constellation.

* * * * *